United States Patent
Kaija

(10) Patent No.: US 12,205,857 B2
(45) Date of Patent: Jan. 21, 2025

(54) ELECTRONIC COMPONENT WITH METALLIC CAP

(71) Applicant: MURATA MANUFACTURING CO., LTD., Nagaokakyo (JP)

(72) Inventor: Kimmo Kaija, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 669 days.

(21) Appl. No.: 17/401,971

(22) Filed: Aug. 13, 2021

(65) Prior Publication Data

US 2022/0108930 A1    Apr. 7, 2022

(30) Foreign Application Priority Data

Oct. 7, 2020    (FI) .................................... 20205985

(51) Int. Cl.
| | | |
|---|---|---|
| *H05K 3/40* | (2006.01) | |
| *H01L 23/043* | (2006.01) | |
| *H01L 23/13* | (2006.01) | |
| *H01L 23/498* | (2006.01) | |
| *H05K 3/30* | (2006.01) | |

(52) U.S. Cl.
CPC ............ *H01L 23/043* (2013.01); *H01L 23/13* (2013.01); *H01L 23/49838* (2013.01); *H01L 23/49872* (2013.01); *H05K 3/305* (2013.01); *H05K 3/40* (2013.01); *H05K 3/4007* (2013.01)

(58) Field of Classification Search
CPC ..... H01L 23/043; H01L 23/13; H01L 23/498; H01L 23/49872; H01L 23/10; H01L 23/06; H01L 2924/16251; H05K 3/40; H05K 3/305; H05K 3/4007; H05K 1/111; H05K 2201/2045

USPC .................................................. 361/117–120
See application file for complete search history.

(56) References Cited

U.S. PATENT DOCUMENTS

| | | | |
|---|---|---|---|
| 4,233,620 A | * | 11/1980 | Darrow .................. H01L 23/10 257/793 |
| 5,552,637 A | | 9/1996 | Yamagata |
| 5,789,810 A | * | 8/1998 | Gross .................... H01L 21/563 257/710 |
| 5,976,912 A | | 11/1999 | Fukutomi et al. |

(Continued)

FOREIGN PATENT DOCUMENTS

| | | |
|---|---|---|
| FR | 2 702 921 A1 | 9/1994 |
| JP | 2005121517 A | 5/2005 |
| JP | 2006182010 A | 7/2006 |

OTHER PUBLICATIONS

Finnish Search Report dated Apr. 6, 2021 corresponding to Finnish Patent Application No. 20205985.

(Continued)

*Primary Examiner* — Danny Nguyen
(74) *Attorney, Agent, or Firm* — SQUIRE PATTON BOGGS (US) LLP

(57) ABSTRACT

This disclosure describes an electronic component comprising a package with a top side and a bottom side and at least one electronic chip housed within an enclosure inside the package. The package comprises a package base on its top side and a metallic cap on its bottom side. At least one electronic chip is separated from the metallic cap by a gap and the metallic cap is attached to the package base to form an enclosure.

5 Claims, 3 Drawing Sheets

(56) References Cited

U.S. PATENT DOCUMENTS

| | | | |
|---|---|---|---|
| 6,118,177 A * | 9/2000 | Lischner | H01L 23/36 |
| | | | 257/E23.101 |
| 6,294,408 B1 * | 9/2001 | Edwards | H01L 23/42 |
| | | | 438/118 |
| 6,362,530 B1 * | 3/2002 | Lee | H01L 23/49816 |
| | | | 257/E23.189 |
| 6,614,108 B1 | 9/2003 | Sanftleben et al. | |
| 8,472,647 B2 * | 6/2013 | Mei | H04R 19/04 |
| | | | 381/175 |
| 2005/0101161 A1 | 5/2005 | Weiblen et al. | |
| 2006/0065972 A1 | 3/2006 | Khan et al. | |
| 2007/0013036 A1 * | 1/2007 | Zhe | H01L 23/057 |
| | | | 257/659 |
| 2007/0278632 A1 * | 12/2007 | Zhao | H01L 23/552 |
| | | | 257/676 |
| 2010/0183181 A1 | 7/2010 | Wang | |
| 2010/0295139 A1 | 11/2010 | Ly et al. | |
| 2017/0364726 A1 * | 12/2017 | Buchan | H10N 30/87 |

OTHER PUBLICATIONS

Office Action dated Oct. 4, 2022, corresponding to Japanese Patent Application No. 2021-140493.
European Search Report dated Feb. 18, 2022, corresponding to European Patent Application No. 21195508.

* cited by examiner

ELECTRONIC COMPONENT WITH METALLIC CAP

FIELD OF THE DISCLOSURE

This disclosure relates to electronic components, and particularly to the component packaging which surrounds electronic chips. The present disclosure further concerns the electronic components where the component packaging comprises a base and a cap which is attached onto the base.

BACKGROUND OF THE DISCLOSURE

Electronic chips, which may also be called dies, are usually prepared by manufacturing various electronic structures on a substrate and cutting the substrate into small, chip-size pieces. Each chip can then be placed inside a protective package which forms an enclosure where the chip is protected from the surrounding environment. The chip can be mechanically attached to a support structure inside the enclosure, such as a die pad, and electrically connected to contacts which extend outside of the enclosure. The packaged chip thereby forms an electronic component which can be mounted on a circuit board.

The protective package can comprise a package base with a die pad, onto which the electronic chip can be attached. A separate cap can then be attached to the package base to seal the electronic chip inside an enclosure formed by the base and the cap. The package base is attached to a circuit board when the component is mounted onto the surface of a circuit board. Document US2005101161 discloses a package with a base and a cap. This arrangement can be problematic in some applications where the electronic chip is sensitive to external vibration. The protective package may resonate at a frequency which influences the operation of the chip.

BRIEF DESCRIPTION OF THE DISCLOSURE

An object of the present disclosure is to provide an apparatus which alleviates the disadvantage mentioned above.

The object of the disclosure is achieved by an arrangement which is characterized by what is stated in the independent claim. The preferred embodiments of the disclosure are disclosed in the dependent claims.

The disclosure is based on the idea of building an inverted protective package which can be mounted onto a circuit board with the cap closer to the surface of the circuit board than the base. By attaching the cap to the circuit board in a suitable manner, the resonance frequencies of the protective package can be shifted to frequencies where they do not disturb the electronic chip.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

This disclosure describes an electronic component comprising a package with a top side and a bottom side and at least one electronic chip housed within an enclosure inside the package. The package comprises a package base on its top side. The package base comprises a chip mounting element where at least one electronic chip is attached. The package further comprises a metallic cap on its bottom side. The at least one electronic chip is separated from the metallic cap by a gap and the metallic cap is attached to the package base to form said enclosure.

In the figures of this disclosure, the plane defined by the x- and y-axes is parallel to the plane of a circuit board to which the electronic component will be attached. The direction defined by the z-axis is perpendicular to the same circuit board plane and to the bottom surface of the metallic cap.

The words "bottom" and "top" refer here only to how the component is intended to be placed onto the circuit board. The bottom side of the component is intended to be attached to the surface of the circuit board. Words such as "above" and "below" are used with the same meaning—a first part which is above a second part is closer to the top side of the component than the second part. Words such as "bottom" and "top", "above" and "below" do not refer to the orientation of the component with regard to the direction of earth's gravitational field either when the component is manufactured or when it is in use, although they can be in agreement with this conventional meaning of top/bottom when the xy-plane is horizontal.

Figure 1A:
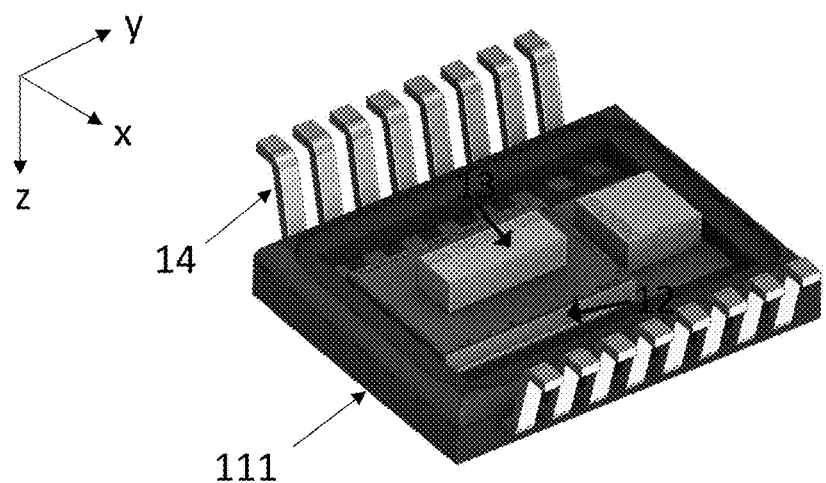
FIG. 1a illustrates an electronic component.

FIG. 1a illustrates an electronic component with a package base 111 which houses several electronic chips 13 attached to a chip mounting element 12. The component also has a number of electronic leads 14 which can be used to make electric connections to the chips 13 outside of the package. In other words, the chips 13 may be connected to the electronic leads 14 inside the package, for example by wire bonding, and the electronic leads 14 may extend outward from the package base in a side direction which is substantially perpendicular to the z-axis. Electric connections to the chips 13 can then be made by connecting the leads 14 to suitable connectors.

The chip mounting element 12 may be located in a recessed area of the package base, so that the package base 111 forms a set of sidewalls which at least partly surround the chips 13. The metallic cap is not illustrated in FIG. 1a. It can be placed over the chip mounting element 12 so that the electronic chips 13 are enclosed between the package base 111 and the metallic cap.

Figure 1B:
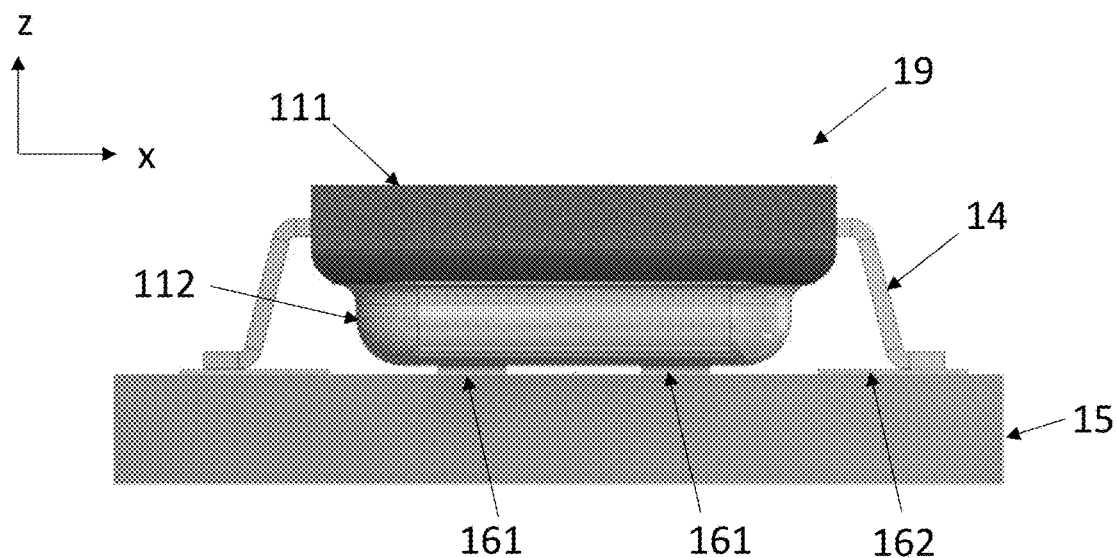
FIG. 1b illustrates an electronic component with a metallic cap.
Figure 1C:
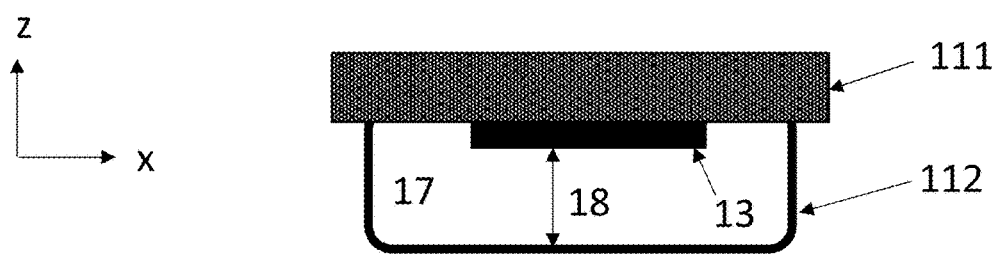

FIG. 1b illustrates an electronic component 19 and a circuit board 15 comprising the electronic component. The electronic component comprises a package base 111 and a metallic cap 112 which together form an enclosure. The metallic cap 112 forms the bottom side of the package. The metallic cap 112 of the electronic component may be attached to the surface of the circuit board 15. The components inside the enclosure are not illustrated in this figure. In FIGS. 1a-1c the z-axis illustrates the "top" direction. In other words, the perspective of FIG. 1 a shows the component upside down. The chip mounting element 12 is on the bottom side of the package base 111 and the electronic chips 13 are attached to the chip mounting element 12 on the bottom side of the package base 111. The orientation of the electronic component is then inverted when it is placed on a circuit board, as FIG. 1b illustrates.

The package base 111 can for example be made of plastic, and it can be manufactured in a moulding process where the base 111 is moulded around leadframe where the chip mounting element 12 and electronic leads have been formed. Other methods can also be used to form a plastic package base. The package base can alternatively be made of a ceramic material. The metallic cap 112 can be attached to the package base 111 with glue or with any other method. The attachment region where the metallic cap is attached to the package base may encircle the enclosure.

The metallic cap can be attached to the surface of the circuit board 15 at one or more attachment points 161, as FIG. 1b illustrates. The attachment can for example be performed by soldering or with an adhesive. FIG. 1c illustrates schematically the electronic chip 13 inside the enclosure 17 formed between the package base 111 and the metallic cap 112. The electronic chip 13 is separated from the metallic cap by a gap 18. The gap 18 may for example be an air gap.

As FIGS. 1b and 1c illustrate, the metallic cap 112 may be shaped so that the bottom surface of the metallic cap 112 is below the attachment region where the metallic cap 112 is attached to the package base 111. In other words the metallic cap 112 may be shaped so that at least a part of the enclosure is formed by the cap 112. The shape of the enclosure 17 and the height of the gap 18 are determined by the shape of the metallic cap 112 and the shape of the package base 111 and the mounting element inside it. As FIG. 1a illustrates, the chip mounting element may be recessed (in the positive z-direction) in relation to the edges of the package base 111 where the base 111 and the metallic cap are attached to each other. The shape of the enclosure 17 and the height of the gap 18 then depend both on the shape of the recess and on the shape of the metallic cap 112.

The electronic leads 14, which may also be called electric contacts, may extend to the surface of the circuit board 15 and to an electric contact pad 162 on the surface of the circuit board. As seen in FIG. 1b, the electronic leads 14 may extend substantially to the same z-coordinate as the bottom surface of the metallic cap 112.

Viscoelastic materials may be used to influence the resonance frequencies and amplitudes of the package, either within the package itself or between the electronic component and the circuit board to which it is attached. The metallic cap may for example comprise a viscoelastic material sandwiched between two metallic layers. In other words, the manufacturing of the cap may comprise for example a lamination process where the viscoelastic material is laminated between two sheets of metal, followed by a shaping process where this laminated structure is shaped into the form of a cap. Alternatively or complementarily, the metallic cap may also be attached to the package base with a viscoelastic adhesive.

Different options are available for facilitating the mechanical attachment of the electronic component to a circuit board. For example, substantially the whole bottom of the metallic cap may be coated with a solder pad material to form a solder pad which extends across substantially the whole bottom of the metallic cap, or dedicated regions of the metallic cap may be coated with the solder pad material to form solder pads only in these regions. The solder pad/pads on the metallic cap may then be attached to one or more solder pads on the surface of a circuit board with a solder material.

Alternatively, the metallic cap may be attached to solder pads on the surface of the circuit board with an adhesive and a solder material. The adhesive may be in contact with the metallic cap, and a metallic plate may be placed between the adhesive and the solder material which fixes the cap to a solder pad on the circuit board. The adhesive may be a viscoelastic material. The viscoelastic material may be attached either directly to the metallic cap or to an attachment pad formed with a solder pad material or any other suitable material on the metallic cap.

Another alternative is to coat one or more areas on the bottom of the metallic cap with a solder pad material to form solder pads in said one or more areas of the bottom of the metallic cap. These solder pads on the metallic cap may then be attached to the surface of a circuit board with a solder material. Corresponding solder pads may be present on the surface of the circuit board. Another alternative is to form solder pads on the surface of the circuit board and to solder them directly to the metallic cap without forming a separate solder pad on the metallic cap for this purpose. Depending on the selected materials, a soldered attachment can be made with or without solder pads on the side of the metallic cap, and with or without solder pads on the circuit board.

Figure 2:
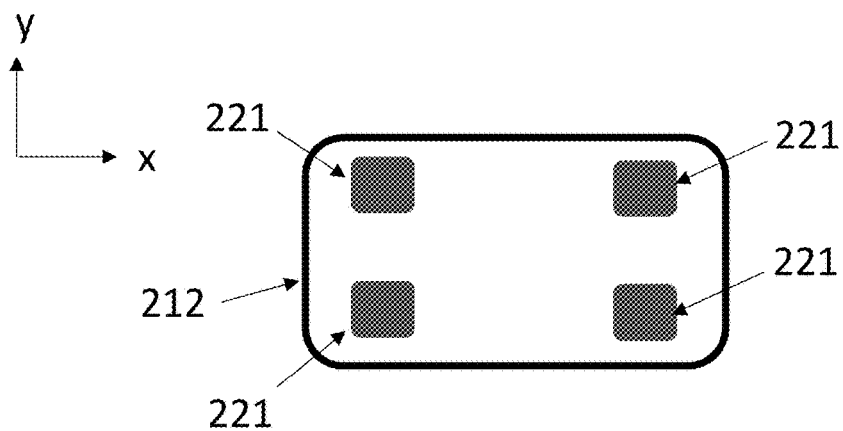
FIG. 2 illustrates the bottom surface of a metallic cap.

FIG. 2 illustrates schematically the bottom of an electronic component with a metallic cap on its bottom side. Reference number 212 corresponds to reference number 112 in FIGS. 1b and 1c. Solder attachment regions 221 are shown on the bottom side of the metallic cap. These regions on the metallic cap may, but do not necessarily have to, comprise solder pads.

A solder attachment between the metallic cap and surface of the circuit board (with or without solder pads), which is typically quite rigid, may be combined with a viscoelastic attachment between the same cap and circuit board. The rigid solder attachment will typically increase the resonance frequencies of the metallic cap fastened to the circuit board, while the viscoelastic attachment will dampen the amplitude of any oscillation which the metallic cap experiences.

Figure 3A:
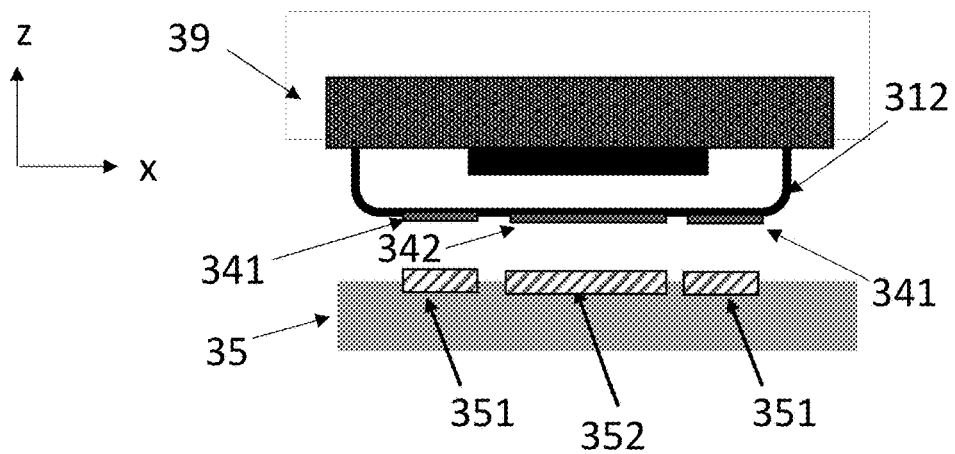
FIG. 3a illustrates a circuit board with an electronic component.

FIG. 3a illustrates a circuit board 35 with an electronic component 39. The electronic component has a metallic cap 312 on its bottom side. The component 39 has been separated from the circuit board 35 to preserve clarity, but it is in mechanical contact with the circuit board when it is attached.

The metallic cap 312 may comprise one or more first attachment regions 341 and one or more second attachment regions 342. The surface of the circuit board 35 may comprise corresponding one or more first attachment regions 351 and one or more second attachment regions 352 which are aligned with the one or more first attachment regions 341 and one or more second attachment regions 342, respectively, on the metallic cap 312. The one or more first attachment regions 341 on the metallic cap 312 may be attached to the one or more first attachment regions 351 on the surface of the circuit board 35 with a solder material. The one or more second attachment regions 342 on the metallic cap 312 may be attached to the one or more second attachment regions 352 on the surface of the circuit board 35 with a viscoelastic adhesive material.

Both the first (351) and second (352) attachment regions on the surface of the circuit board 35 may comprise solder pads. The first (341) and second (342) attachment regions on the metallic cap do not necessarily need attachment pads, but it is possible to form solder pads or other attachment pads also on the cap, as mentioned above.

The one or more second attachment regions 352 on the surface of the circuit board may comprise solder pads, and the one or more second attachment regions 342 on the metallic cap may comprise a metallic layer which is fixed to the metallic cap with a viscoelastic adhesive. This metallic layer can then be fixed to the solder pad in the second attachment region 352 with a solder material. In other words, the metallic cap can be attached to the one or more second attachment regions 352 on the surface of the circuit board 35 with a layered structure which comprises a layer of viscoelastic adhesive material closest to the metallic cap 312, a layer of solder material closest to the solder pads in the second attachment regions 352 on the surface of the circuit board 35, and a metallic layer between the layer of viscoelastic adhesive material and the layer of solder material.

Figure 3B:
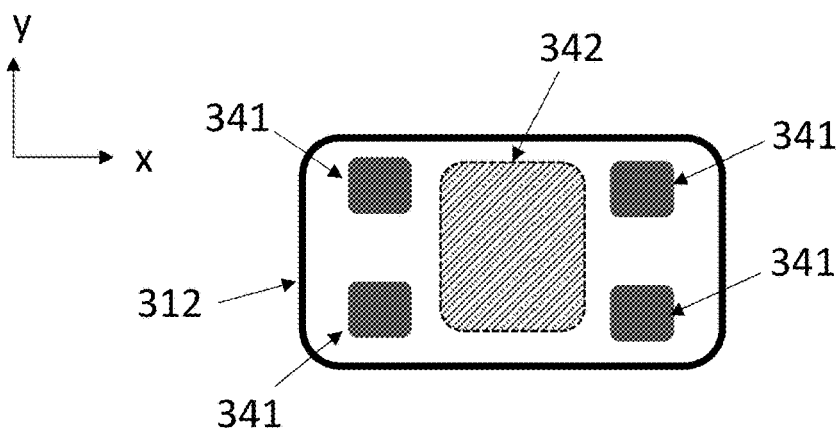
FIG. 3b illustrates the bottom surface of a metallic cap.

FIG. 3b shows the bottom surface of the metallic cap 312 in the xy-plane and illustrates one possible placement of the one or more first attachment regions 341 and second attachment regions 342 on this surface. Other placement geometries and relative dimensions are also possible.

Figure 4A:
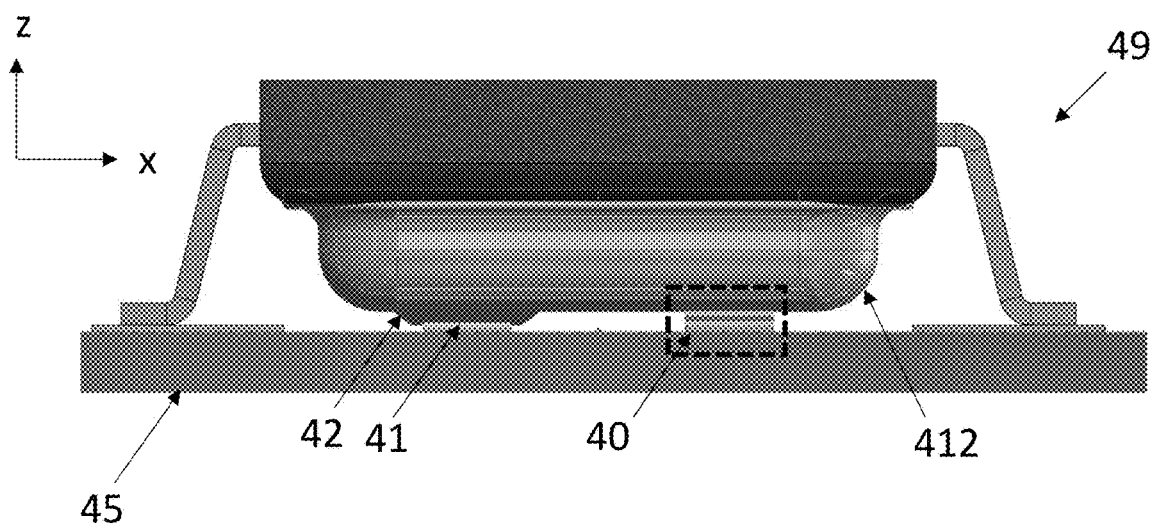
FIG. 4a illustrates a circuit board comprising an electronic component.
Figure 4B:
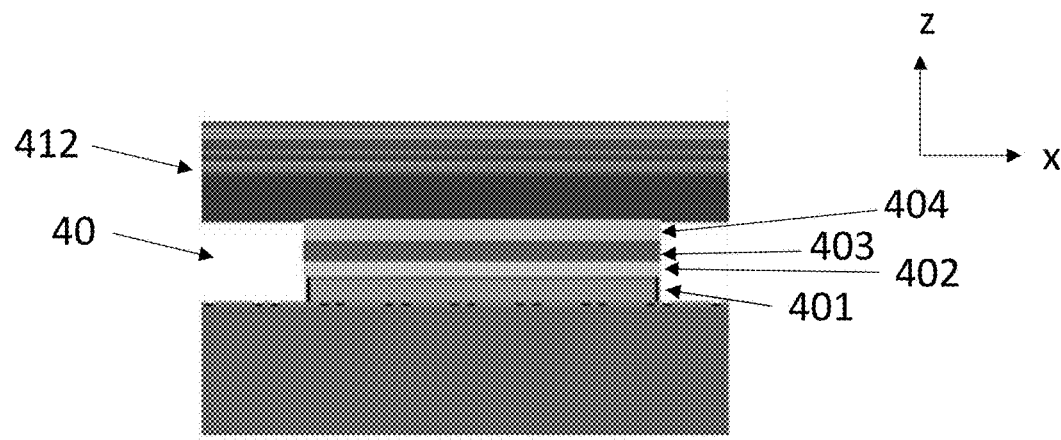
FIG. 4b illustrates a layered structure.

FIG. 4a illustrates a circuit board comprising an electronic component. Reference numbers 412, 45 and 49 correspond to reference numbers 312, 35 and 39 in FIG. 3a. The figure illustrates a layered structure 40 which attaches the metallic cap to the surface of the circuit board. FIG. 4b illustrates the layered structure 40 in more detail. It comprises a solder pad 401 on the surface of the circuit board 45, a metallic layer 403 and a layer of solder material 402 which attaches the metallic layer 403 to the solder pad 401. The layered structure further comprises a layer of viscoelastic adhesive material 404 which attaches the other side of the metallic layer 403 to the metallic cap 412. FIG. 4a also illustrates a second attachment structure 41 where a solder pad on the metallic cap 412 is attached to a solder pad on the surface of the circuit board with a solder material. The layered structure 40 is thicker than the attachment structure 41, but the metallic cap comprises a bulge 42 which extends in the z-direction to compensate for this difference.

The invention claimed is:

1. A circuit board comprising:
 an electronic component comprising a package with a top side and a bottom side and
 at least one electronic chip housed within an enclosure inside the package,
  wherein the package comprises a package base on its top side, and the package base comprises a chip mounting element where at least one electronic chip is attached, and the package further comprises a metallic cap on its bottom side, wherein the at least one electronic chip is separated from the metallic cap by a gap and the metallic cap is attached to the package base to form said enclosure, and the metallic cap forms the bottom side of the package, wherein the metallic cap of the electronic component is attached to a surface of the circuit board, and the metallic cap comprises one or more first attachment regions and one or more second attachment regions, and
 wherein the surface of the circuit board comprises corresponding one or more first attachment regions and one or more second attachment regions which are aligned with the one or more first attachment regions and one or more second attachment regions, respectively, on the metallic cap, and the one or more first attachment regions on the metallic cap are attached to the one or more first attachment regions on the surface of the circuit board with a solder material, and the one or more second attachment regions on the metallic cap are attached to the one or more second attachment regions on the surface of the circuit board with a viscoelastic adhesive material.

2. The circuit board according to claim 1, wherein the metallic cap comprises a viscoelastic material sandwiched between two metallic layers.

3. The circuit board according to claim 1, wherein substantially a whole bottom of the metallic cap is coated with a solder pad material to form a solder pad which extends across substantially the whole bottom of the metallic cap.

4. The circuit board according to claim 1, wherein one or more areas on the bottom of the metallic cap are coated with a solder pad material to form solder pads in said one or more areas of the bottom of the metallic cap.

5. The circuit board according to claim 1, wherein the one or more second attachment regions on the surface of the circuit board comprise solder pads, and the one or more second attachment regions on the metallic cap are attached to the one or more second attachment regions on the surface of the circuit board with a layered structure which comprises a layer of viscoelastic adhesive material closest to the metallic cap, a layer of solder material closest to the solder pads on the second attachment regions on the surface of the circuit board, and a metallic layer between the layer of viscoelastic adhesive material and the layer of solder material.

* * * * *